United States Patent
Hezar et al.

(10) Patent No.: US 9,800,272 B2
(45) Date of Patent: Oct. 24, 2017

(54) CIRCUITS AND METHODS FOR TRANSMITTING SIGNALS

(71) Applicant: Texas Instruments Incorporated, Dallas, TX (US)

(72) Inventors: Rahmi Hezar, Allen, TX (US); Lei Ding, Plano, TX (US); Joonhoi Hur, San Diego, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 288 days.

(21) Appl. No.: 14/136,156

(22) Filed: Dec. 20, 2013

(65) Prior Publication Data

US 2015/0180692 A1    Jun. 25, 2015

(51) Int. Cl.
| | |
|---|---|
| *H04K 1/02* | (2006.01) |
| *H03F 1/00* | (2006.01) |
| *H04B 1/04* | (2006.01) |
| *H04L 27/26* | (2006.01) |
| *H04L 27/20* | (2006.01) |

(52) U.S. Cl.
CPC .............. *H04B 1/04* (2013.01); *H04L 27/206* (2013.01); *H04L 27/2602* (2013.01)

(58) Field of Classification Search
CPC . H04L 27/34; H04L 27/362; H04L 2027/003; H04L 1/0001; H04L 1/0042; H04L 27/2602; H04L 5/12; H04L 27/2647
USPC ........................................... 375/297; 330/185
See application file for complete search history.

(56) References Cited

U.S. PATENT DOCUMENTS

| | | | | |
|---|---|---|---|---|
| 6,054,894 A | * | 4/2000 | Wright | H03F 1/0294 330/124 R |
| 7,184,723 B2 | * | 2/2007 | Sorrells | H03C 5/00 330/124 R |
| 7,260,368 B1 | * | 8/2007 | Blumer | H03D 7/1433 375/261 |
| 8,755,454 B2 | * | 6/2014 | Sorrells et al. | 375/295 |
| 2002/0027958 A1 | * | 3/2002 | Kolanek | H03F 1/0294 375/297 |
| 2004/0027198 A1 | * | 2/2004 | Chandrasekaran | H03F 1/0294 330/149 |
| 2004/0092240 A1 | * | 5/2004 | Hayashi | H04L 27/2275 455/214 |
| 2004/0184559 A1 | * | 9/2004 | Ballantyne | H03C 1/547 375/300 |
| 2007/0211835 A1 | * | 9/2007 | Inagawa | H04L 7/0058 375/343 |
| 2007/0280382 A1 | | 12/2007 | Batra et al. | |
| 2009/0034653 A1 | | 2/2009 | Rofougaran | |

(Continued)

OTHER PUBLICATIONS

International Search Report and Written Opinion for PCT/US2014/058394 mailed Mar. 26, 2015.

*Primary Examiner* — Daniel Washburn
*Assistant Examiner* — Sarah Hassan
(74) *Attorney, Agent, or Firm* — Michael A. Davis, Jr.; Charles A. Brill; Frank D. Cimino

(57) ABSTRACT

For generating quantized signals, a quantized phase domain related to quantized phases of an input signal is generated. Vectors that the input signal may occupy are calculated based on the quantized phase domain. A first quantized phase of a first component of the input signal is generated per the quantized phase domain, and a second quantized phase of a second component of the input signal is generated per the quantized phase domain.

20 Claims, 6 Drawing Sheets

(56) References Cited

U.S. PATENT DOCUMENTS

2011/0136443 A1\* 6/2011 Milenkovic ........... G06F 1/0255
 455/76
2013/0049861 A1\* 2/2013 Lozhkin ................ H03F 1/0294
 330/185

\* cited by examiner

CIRCUITS AND METHODS FOR TRANSMITTING SIGNALS

BACKGROUND

Some communications techniques use "linear modulation using non-linear components" (LINC) modulation. LINC modulation is sometimes referred to as constant envelope out-phasing. LINC modulation transforms traditional Cartesian modulated RF signals with I and Q components to a combination of two constant envelope signals. The constant envelope signals are referred to as S1 and S2 signals. The S1 and S2 signals are phase modulated and can have any value in the phase domain.

Two issues make LINC modulation difficult at higher frequencies. The first is the calculations required to achieve LINC modulations. More specifically, inverse cosine and inverse tangent functions must be calculated. These functions are time consuming to calculate. In some embodiments, look up tables are used to determine the inverse cosine and inverse tangent values, but the look up tables require extensive memory, which is costly. The second problem is that the S1 and S2 signals are phase modulated, which is difficult to achieve with the accuracy required at higher frequencies.

SUMMARY

For generating quantized signals, a quantized phase domain related to quantized phases of an input signal is generated. Vectors that the input signal may occupy are calculated based on the quantized phase domain. A first quantized phase of a first component of the input signal is generated per the quantized phase domain, and a second quantized phase of a second component of the input signal is generated per the quantized phase domain.

DETAILED DESCRIPTION

Circuits and methods are described herein that overcome shortfalls in LINC modulation, asymmetrical multi-level out-phasing (AMO) transmitters, and similar transmitters and modulation techniques. A S1/S2 phase domain is quantized, and all the possible I and Q vectors or values are determined based on the quantized S1/S2 domain. The I and Q vectors are discrete because the S1/S2 domain has been quantized. A quantizer quantizes the I and Q components of a complex input signal and fits them to the values in the I/Q domain that have been previously calculated. The S1 and S2 components of the input signal are then readily determined in response to the quantized I and Q components of the input signal.

Figure 1:
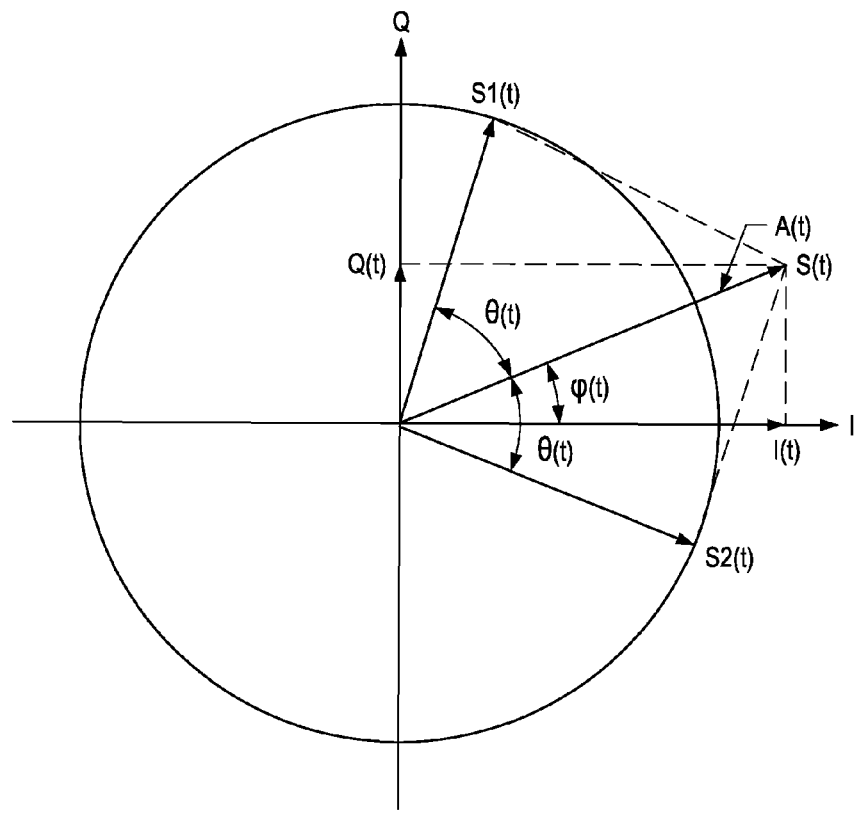
FIG. 1 is a chart showing LINC modulation.

Having summarily described the modulation technique, more detailed embodiments will now be described. An example of LINC modulation in Cartesian coordinates is shown by the chart of FIG. 1. The chart is adapted onto the unit circle wherein the horizontal or x-axis is representative of the I component of a signal S(t) and the vertical or y-axis is representative of the Q component of the signal S(t). The value of the Q component is sometimes referred to as Q(t) and the value of the I component is sometimes referred to as I(t). In LINC modulation, the signal S(t) is represented by two components or values S1(t) and S2(t), which are sometimes referred to herein simply as S1 and S2. The magnitudes of S1 and S2 are the same, however, the phase angles $\theta(t)$ and $\phi(t)$ between the signals S1 and S2 change to modulate the signal S(t). As shown in FIG. 1, the value of S(t) as represented by Cartesian coordinates is given by equation (1) as follows:

$$S(t) = I(t)\cos(\omega_c t) + Q(t)\sin(\omega_c t) \quad \text{Equation (1)}$$

The term $\omega_c$ is the frequency of the carrier of the signal S(t). The value of S(t) is also equal to the sum of S1(t) and S2(t), wherein S1(t) and S2(t) are shown by equations (2) and (3) as follows:

$$S1(t) = \frac{A_{max}}{2} e^{j(w_c t + \varphi(t) + \theta(t))} \quad \text{Equation (2)}$$

$$S2(t) = \frac{A_{max}}{2} e^{j(w_c t + \varphi(t) + \theta(t))} \quad \text{Equation (3)}$$

The value of A(t), which is the magnitude of S(t), is calculated using the Pythagorean theorem, and $A_{max}$ is maximum value of A(t) as shown by equation (4):

$$A(t) = \sqrt{I^2(t) + Q^2(t)} \quad \text{Equation (4)}$$

As described above, one of the problems with converting Cartesian signals to ZINC modulated signals is that values of inverse cosine and inverse tangent have to be calculated to determine the phase angles. As shown in FIG. 1, the value of $\theta(t)$ is calculated based on the inverse cosine as shown by equation (5) and the value of $\phi(t)$ is calculated based on the inverse tangent as shown by equation (6).

$$\theta(t) = \cos^{-1}\left(\frac{A(t)}{A_{max}}\right) \quad \text{Equation (5)}$$

$$\varphi(t) = \tan^{-1}\left(\frac{Q(t)}{I(t)}\right) \quad \text{Equation (6)}$$

The calculations of inverse cosine and inverse tangent are complex. In some embodiment, they are not calculated, but are estimated using a look up table. Look up tables take up a great deal of memory area on processors, which is costly. In addition, the phase modulator that generates the phases of S1 and S2 is complex and is sensitive to timing errors. For example, a slight mismatch between the actual phase and the intended phase results in large linearity errors in the output signal. In addition, physical distances and parasitic values between S1 and S2 paths are difficult to match.

Figure 2:
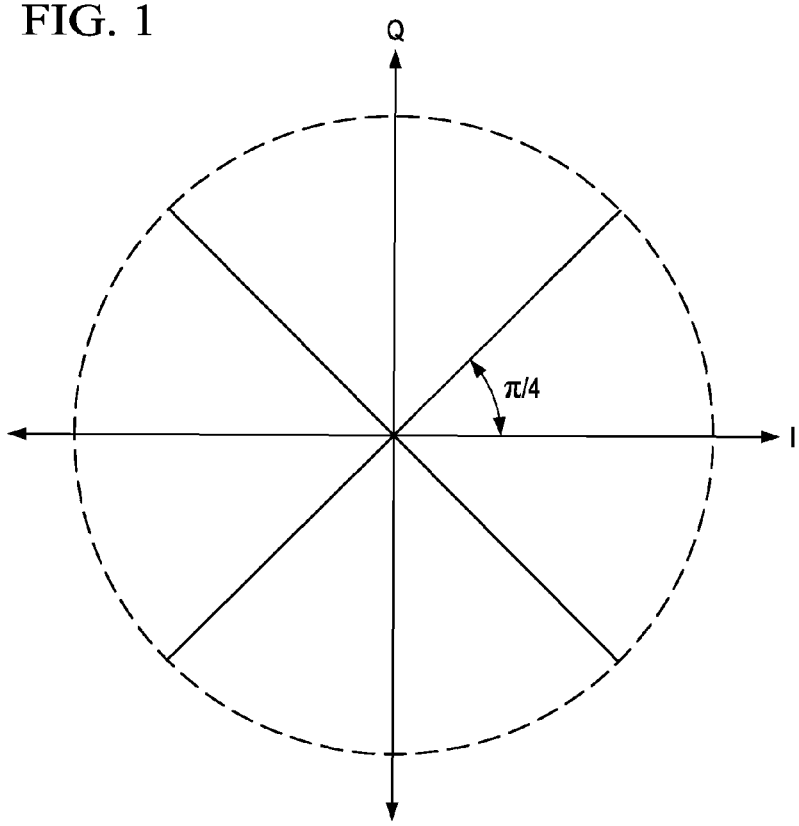
FIG. 2 is a chart showing a quantized phase domain.
Figure 3:
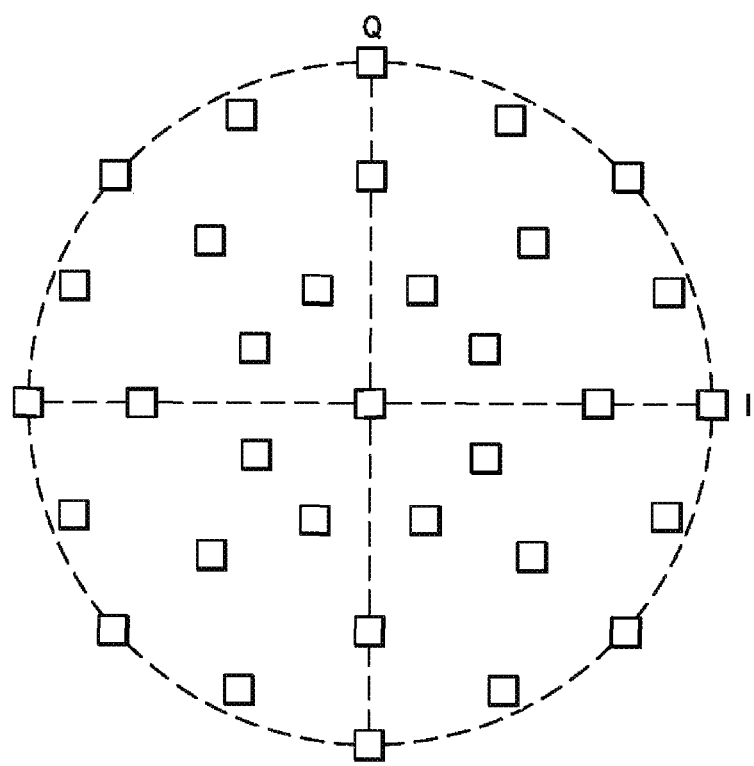
FIG. 3 is the I/Q domain calculated based on the quantized phase domain of FIG. 2.

In order to overcome the problems described above, the phase domain of the S1 and S2 signals is quantized as shown in FIG. 2. The signal S(t) is on a carrier clock, so the quantized phase domain is related to the different phases of the carrier clock. In the example of FIG. 2, the values of S1 and S2 are limited to eight different phases of the carrier clock. Based on the quantized phase domain of FIG. 2, the I and Q domain is calculated as shown in FIG. 3. All of the possible values in the I and Q domain are calculated based on all the possible combinations of S1 and S2 present in the quantized phase domain of FIG. 2. Because the S1/S2 phase domain is quantized, there are only a limited number of possible I and Q values based on the S1 and S2 combinations. By calculating all of the I and Q values, there is no need to perform the complex calculations of inverse cosine and inverse tangent during signal processing. The values of I and Q may be stored in a small look up table that is readily accessed. In addition, the sensitivity of the phase modulation between S1 and S2 is eliminated. The I and Q components of a signal are processed together and quantized onto the chart of FIG. 3. Because the quantized S1/S2 domain was used to generate the I/Q domain, the S1 and S2 values are readily determined based on the quantized I and Q values. More specifically, the S1 and S2 values are determined by the phase domain of FIG. 2, which was used to create the I/Q domain of FIG. 3.

Figure 4:
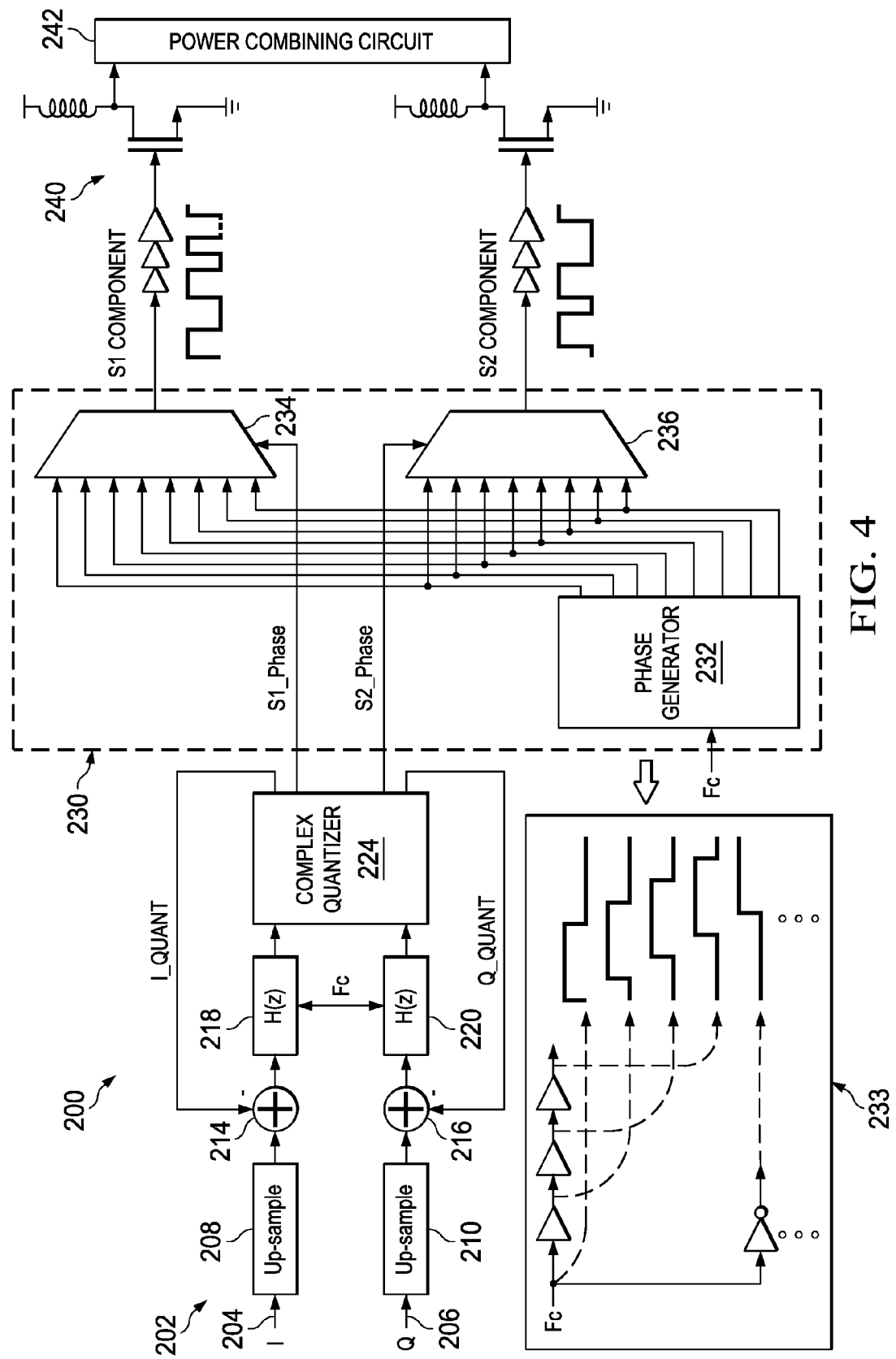
FIG. 4 is an embodiment of a circuit for implementing the procedures set forth in FIGS. 2 and 3.

Having described the mathematical process of the modulation, a circuit for implementing the process will now be described. Reference is made to FIG. 4, which shows an embodiment of a block diagram of a circuit 200 for implementing the processes described above. The circuit 200 includes an input 202 wherein complex components of an input signal are received on an I input 204 and a Q input 206. Both the I input 204 and the Q input 206 are connected to sampling circuits 208 and 210 where the complex components are upsampled by a frequency referred to as Fc. In some embodiments, the frequency Fc varies between 1.8 GHz to 2.5 GHz. The sampled signals are output to adders 214 and 216. As described in greater detail below, the adders 214 and 216 are components of noise shaping elements of the circuit 200.

The adders 214 and 216 output signals to filters 218 and 220, which provide for loop filtering of the sampled I and Q signals. The outputs of the filters 218 and 220 are input to a quantizer 224, which is sometimes referred to as a complex quantizer 224. The quantizer 224 calculates the S1 and S2 quantized phases from the I and Q quantized values. The quantizer 224 generates or has access to the quantized I and Q domain as shown in FIG. 3, which was calculated from the S1/S2 domain of FIG. 2. Because the I and Q components are quantized, there are only a limited number of I and Q vectors that may be selected from the chart of FIG. 3. Based on these quantized values, the quantized values of S1 and S2 are generated by the quantizer 224.

In the embodiment of FIG. 4, the quantizer 224 outputs voltages or signals representative of the S1 and S1 phases, which are shown as S1_phase and S2_phase. In addition, the quantizer outputs voltages representative of the quantized I and Q values. In some embodiments, the quantizer 224 outputs digital values representative of the S1 and S2 phases. As described below, the S1 and S2 phases are used to generate discrete phase modulated signals. The voltages representative of the quantized I and Q values are fed back to the adders 214 and 216 where they are subtracted from the sampled I and Q components that are output by the sampling circuits 208 and 210. The quantized I and Q values in combination with the filters 218 and 220 provide for noise shaping of the signals input to the quantizer 224.

The outputs of the quantizer 224 are input to a discrete phase modulator 230 that converts the digital values of the S1 and S1 phases to discrete S1 and S2 phase modulated signals. A phase generator 232 generates discretely delayed pulses as shown by the timing diagram 233. The pulses generated by the pulse generator 232 are input to multiplexers 234 and 236. The control signals for the multiplexers 234 and 236 are the voltages or digital values representative of the S1 and S2 phases. The control signals determine which quantized phase is selected from the inputs of the multiplexers 234 and 236. The outputs of the multiplexers 234 and 236 are quantized S1 and S2 components of phase modulated signals, which provide for quantized digital RF signals. The S1 and S2 signals are output to a power amplifier 240. The S1 and S2 signals are then combined by way of a conventional power combining circuit 242. In some embodiments, the power combining circuit 242 is a passive circuit.

The circuit 200 outputs a phase modulated signal wherein the phases are discrete values. Accordingly, the complex calculations required for conventional phase modulation are not required, so the circuit 200 is able to operate at high frequencies. The accuracy of the phase modulation is able to be increased by increasing the number of possible phases in the S1/S2 domain, which increases the number of possible quantized I and Q values. The circuit has many benefits over conventional modulators. For example, in some embodiments, the upsampling performed by the sampling circuits 208 and 210 operates at a high frequency so that noise is beyond the bandwidth of the circuit. By quantizing the I and Q components simultaneously, they can be fit onto the I/Q domain of FIG. 3, which quickly yields the quantized phases from the S1/S2 phase domain of FIG. 2.

Figure 5:
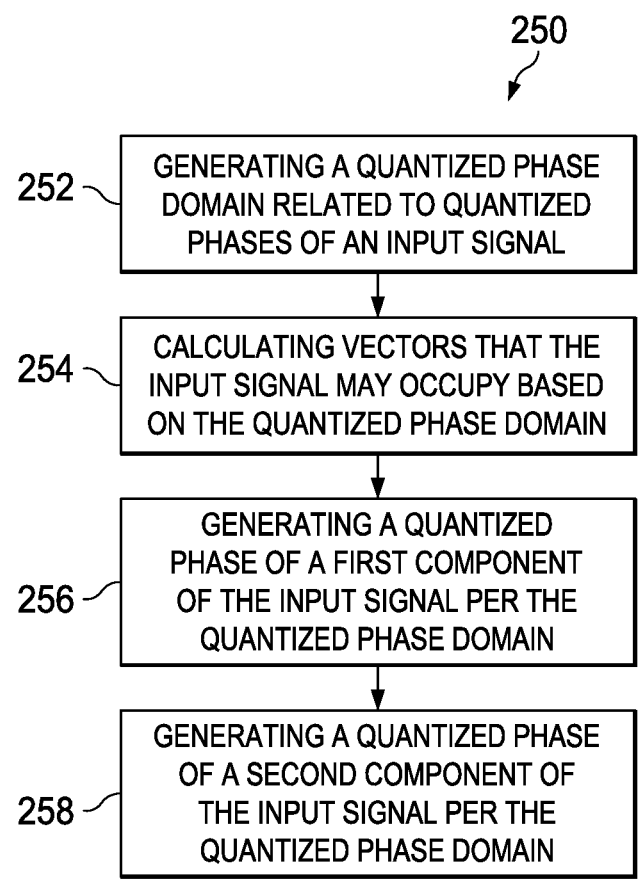
FIG. 5 is a flow chart showing the operation of the circuit of FIG. 4.

The operation of the circuit 200 and related techniques of generating quantized signals are illustrated by the flow chart 250 of FIG. 5. In step 252 a quantized phase domain related to quantized phases of an input signal is generated. In the embodiments described above, the phase domain corresponds to the chart of FIG. 2. Vectors that the input signal may occupy are calculated based on the quantized phase domain in step 254. In the embodiments described above, the examples of the vectors are shown in FIG. 3. In step 256, a quantized phase of a first component of the input signal is generated per the quantized phase domain. A similar process is performed in step 258 where a quantized phase of a second component of the input signal is generated per the quantized phase domain.

Figure 6:
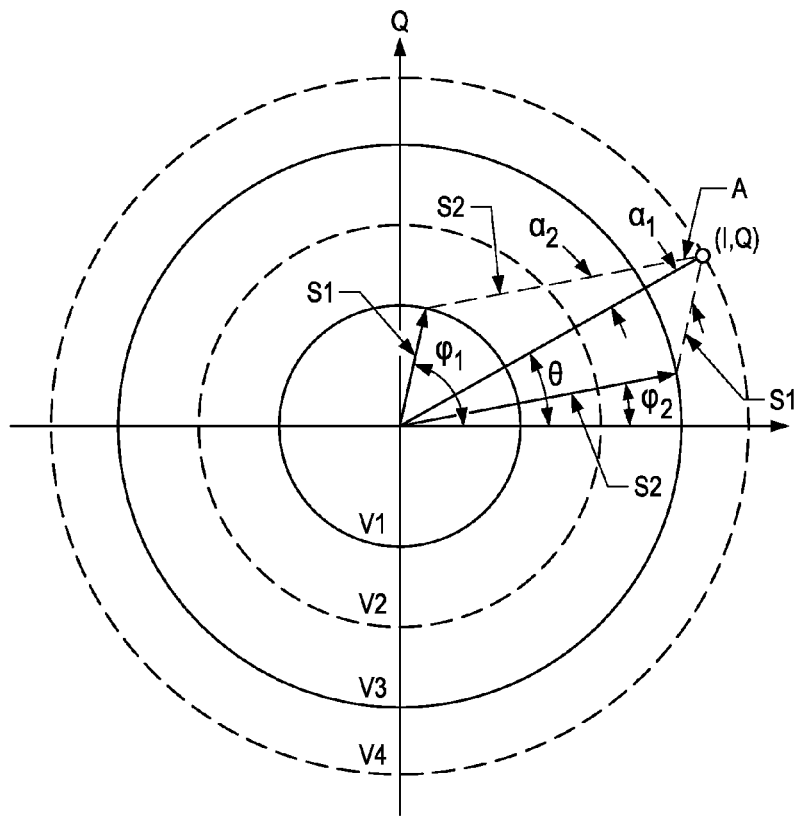
FIG. 6 is a chart showing an embodiment of asymmetrical multi-level out-phasing modulation.

Portions of the above-described quantization may be applied to asymmetrical multi-level out-phasing (AMO) transmitters and modulation techniques using complex noise shaping and pulse width modulation (PMW). AMO transmission techniques decompose a complex signal into two components that are referred to as S1 and S2. In some embodiments, the components are referred to as a1 and a2. An example of the AMO technique is shown in the chart of FIG. 6, where I and Q components of a signal are decomposed to S1 and S2 components. In AMO, the magnitudes of the S1 and S2 components do not necessarily have the same magnitudes, which results in different voltage levels for the S1 and S2 components.

As shown in FIG. 6, the complex signal has I and Q components and is defined by polar coordinates. An amplitude or magnitude A is calculated by the Pythagorean theorem as shown in equation (7) and the angle $\theta$ is calculated by equation (8) as shown below.

$$A = \sqrt{I^2 + Q^2} \quad \text{Equation (7)}$$

$$\theta = \tan^{-1}\frac{Q}{I} \quad \text{Equation (8)}$$

The angles $\alpha_1$ and $\alpha_2$ are calculated by equations (9) and (10) as follows:

$$\alpha_1 = \cos^{-1}\left(\frac{a_1^2 + A^2 - a_2^2}{2Aa_1}\right) \quad \text{Equation (9)}$$

$$\alpha_2 = \cos^{-1}\left(\frac{a_2^2 + A^2 - a_1^2}{2A\alpha_2}\right) \quad \text{Equation (10)}$$

As can be seen from the above equations, complex calculations are required for AMO transmissions. In addition to the above calculations, the output level of an AMO transmitter changes in order to reflect the different amplitude values for S1 and S2. In many conventional embodiments, the output level is changed by changing the voltage supply level to an output amplifier, which is inefficient. In some other conventional embodiments, the AMO is used with discrete pulse width modulation (PWM) of the radio frequency (RF) carrier. In these embodiments, the pulse widths are varied to change the output power instead of changing the supply voltage to the output amplifier.

In the embodiments described herein, the output levels in the S1/S2 phase domain are quantized, which provides for discrete output power levels. The I/Q domain is then calculated based on the discrete S1/S2 phase domain. The result is that the I/Q domain offers more resolution at lower power levels. In some embodiments, the multiple power levels are implemented by carrier pulse counting during a fixed period. For example, a RF carrier pulse may include pulses that are generated during a period of time. In some embodiments, sigma/delta modulation using a sigma/delta modulator (SDM) is used for the carrier pulse count transmission.

In some embodiments, the SDM operates at a clock frequency that is the carrier frequency divided by the number of power levels in the AMO. For an M-level AMO with a carrier frequency Fc, the clock frequency Fclk of the SDM will be Fc/M. The SDM uses the complex quantizer as described above to reduce the phase values of S1 and S2 to discrete values. The SDM outputs have pre-quantized phase values and M possible amplitude values for the S1 and S2 components. The modulation of the amplitude is implemented by changing the number RF clock pulses within one Fclk window. An output value of k (k=0 . . . M) for an S1/S2 amplitude is translated as k carrier pulses placed in an Fclk window.

Figure 7:
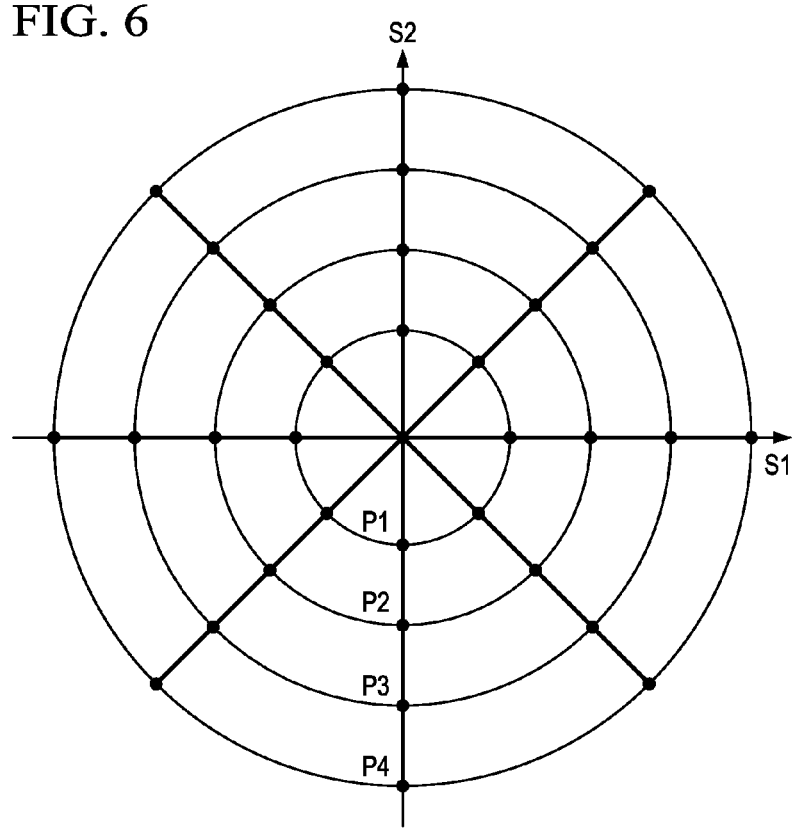
FIG. 7 is a chart showing an embodiment of a quantized S1/S2 phase domain with discrete power level outputs.

In this embodiment, the S1/S2 phase domain is quantized to also include discrete output power levels as shown by the chart of FIG. 7. In the embodiment of FIG. 7, there are eight discrete phases and four discrete power levels, which yield a total of 32 possible discrete output levels. The discrete I/Q domain is then calculated based on the discrete S1/S2 phase domain. The embodiment of the discrete S1/S2 phase domain of FIG. 7 yields 1024 discrete levels in the I/Q domain.

As briefly described above, the discrete power levels may be transmitted by way of a predetermined number of pulses or sidebands transmitted during a period. For example a power level of P1 may be conveyed by transmitting one pulse or sideband during the period and a power level of P4 may be conveyed by transmitting four pulses or sidebands during the period.

Figure 8:
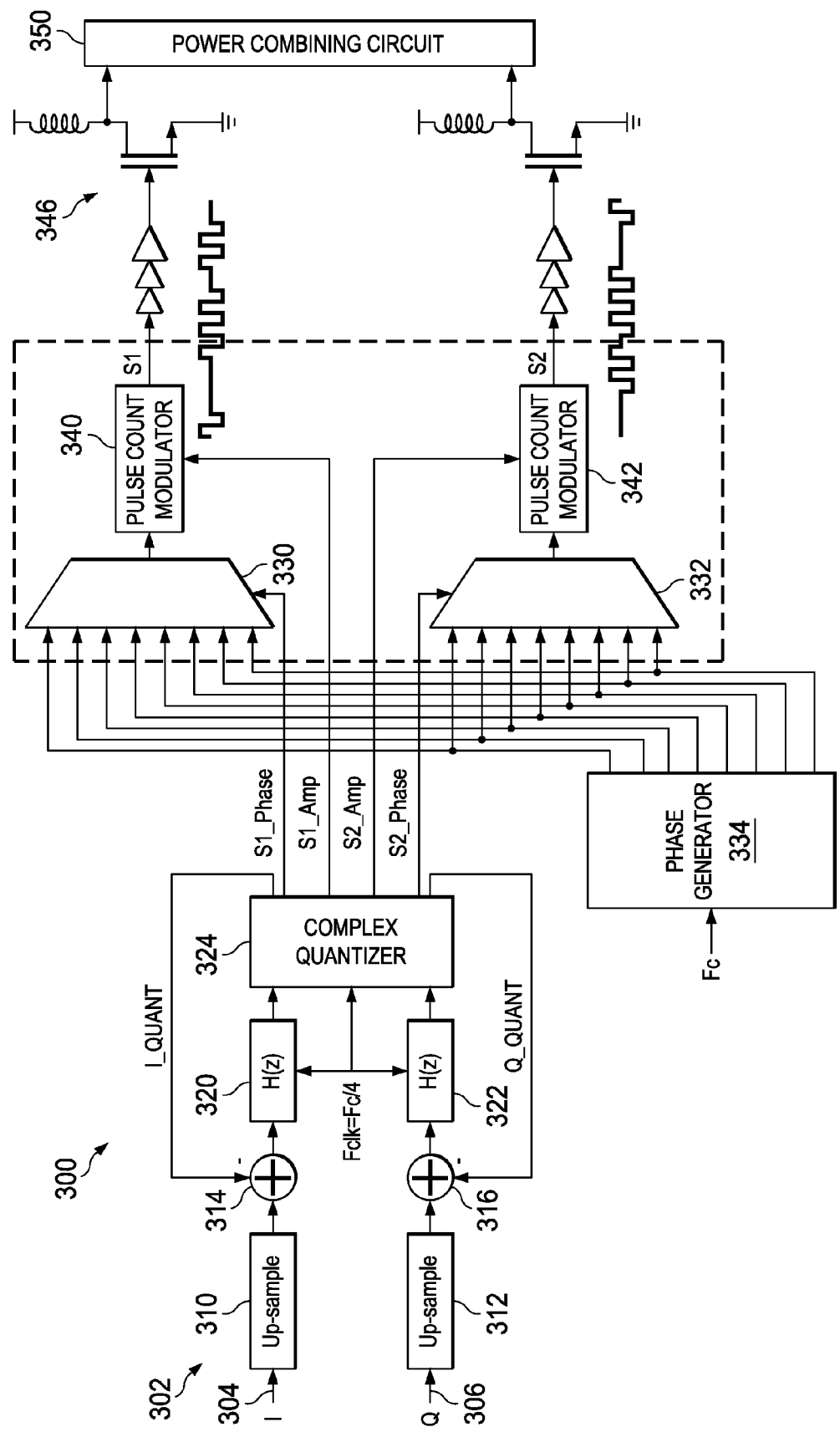
FIG. 8 is an embodiment of a circuit generating asymmetrical multi-level out-phasing modulated signals.

Reference is made to a circuit 300, FIG. 8, that implements the techniques of AMO transmission as described above. The circuit 300 has an input 302 that includes a first input 304 and a second input 306. The first input 304 is sometimes referred to as the I input 304 and the second input 306 is sometimes referred to as the Q input 306. The I input 304 receives the I component of a complex signal and the Q input 306 receives the Q component of a complex signal. The I input 304 is connected to a sampling circuit 310 that upsamples the I component of the complex signal. Likewise, the Q input 306 is connected to a sampling circuit 312 that upsamples the Q component of the complex signal.

The output of the sampling circuit 310 is connected to an adder 314 and the output of the sampling circuit 312 is connected to an adder 316. As described below, error signals are input to the adders 314 and 316 to subtract quantized I and Q error signals. The output of the adder 314 is connected to a filter 320 and the output of the adder 316 is connected to a filter 322. The filters 320 and 322 provide loop filtering and noise shaping. The filters 320 and 322 operate at a frequency Fclk, which is equal to Fc/4 where there are four possible power levels in the quantized S1/S2 domain. The frequency Fclk is the operating frequency of the sigma/delta modulator.

The outputs of the filters 320 and 322 are connected to a quantizer 324, which is sometimes referred to as a complex quantizer 324. The quantizer 324 generates the quantized S1/S2 phase domain of FIG. 5 and generates the quantized I and Q vectors, which may be generated by way of a look up table. The quantizer 324 fits the outputs of the filters 320 and 322 to the I/Q domain generated from the quantized S1/S2 domain of FIG. 7. The corresponding quantized S1 and S2 values are then readily determined from the S1/S2 domain of FIG. 7. Because the circuit 300 is an AMO transmitter, the quantizer 324 outputs S1 and S2 phase and amplitude values or voltages representing these values. In addition, the quantizer 324 outputs voltages representative of the I and Q quantized values, which are fed back to the adders 314 and 316 for noise shaping.

The voltages representative of the S1 and S2 phases are control signals for multiplexers 330 and 332. A phase generator 334 generates pulses that are input to the multiplexers 330 and 332. In some embodiments, the phase generator 334 is identical to the phase generator 232 of FIG. 4. The phase generator 334 generates pulses that are delayed from each other by predetermined periods as shown by the chart 233 of FIG. 4. In the embodiment of FIG. 7, the phase generator 334 operates at the frequency Fc.

The phases selected by the multiplexers 330 and 332 are output to pulse count modulators 340 and 342. In some embodiments, the modulators 330 and 332 are RF pulse count modulators and operate similar to sigma/delta modulators. Each of the modulators 340 and 342 has an input from the quantizer 324. The modulator 340 has an input that is a voltage representative of the amplitude of the quantized S1 component and the modulator 342 has an input that is a voltage representative of the amplitude of the quantized S2 component. The modulators 340 and 342 generate pulses on the output signals that are representative of the S1 and S2 amplitudes. In some embodiments, the number of pulses generated in a sampling period is indicative of the power level. For example one pulse generated during the sampling period is indicative of a first power level and four pulses generated during the sampling period is indicative of a fourth power level. The pulse count modulators 340 and 342 may also increase the number of carriers to increase the power. In some embodiments, one carrier is representative of a first power level and four carriers are representative of a fourth power level.

The signals generated by the modulators 340 and 342 are output to an amplifier 346 and then to a power combining circuit 350. The power levels of the S1 and S2 components are in the modulated signal, so the power levels of amplifier 346 do not have to change to reflect the power levels as they would in conventional AMO transmitters. The power combining circuit 350 combines the S1 and S2 components for transmission. In some embodiments, the power combining circuit 350 is a passive circuit.

While certain embodiments of circuits and techniques have been described in detail herein as an aid to understanding of applicants' inventive concepts, it is to be understood that the inventive concepts may be otherwise variously embodied and employed and that the appended claims are intended to be construed to include such variations, except insofar as limited by the prior art.

What is claimed is:

1. Circuitry for generating a discrete amplitude signal pair having quantized phases, the circuitry comprising:
   first and second inputs to receive first and second components of an input signal, wherein the input signal is a complex signal, the first component is a variable amplitude I component, and the second component is a variable amplitude Q component;
   filters to noise shape the input signal;
   a quantizer, coupled to the filters, to quantize the noise-shaped input signal to fit a vector pair from among a domain of discrete amplitude vectors having quantized phases, wherein combined amplitudes and combined phases of the vector pair are represented by an I value and a Q value from the quantizer;
   a first adder, coupled to the quantizer and to the first input, to subtract the I value from the first component of the input signal to generate a first difference thereof;
   a second adder, coupled to the quantizer and to the second input, to subtract the Q value from the second component of the input signal to generate a second difference thereof, wherein the filters are: coupled to the first and second adders; and configured to loop filter the first and second differences for generating the noise-shaped input signal; and
   a discrete phase modulator, coupled to the quantizer, to convert the vector pair from the quantizer into the discrete amplitude signal pair having quantized phases.

2. The circuitry of claim 1, wherein the discrete amplitude vectors have a same constant discrete amplitude.

3. The circuitry of claim 1, wherein the discrete amplitude vectors have various discrete amplitudes.

4. The circuitry of claim 1, wherein the vector pair is represented by voltages.

5. The circuitry of claim 1, wherein the vector pair is represented by digital values.

6. The circuitry of claim 1, wherein the discrete phase modulator includes a phase generator to generate multiple lines of discretely delayed pulses, wherein the multiple lines are representative of respective quantized phases.

7. The circuitry of claim 6, wherein the discrete amplitude vectors have a same constant discrete amplitude, the discrete phase modulator includes multiplexers coupled to the phase generator and to the quantizer, and converting the vector pair includes:
   with the multiplexers, selecting lines from among the multiple lines, wherein the pulses of the selected lines are representative of quantized phases of the vector pair from the quantizer.

8. The circuitry of claim 7, further comprising:
   a power amplifier, coupled to the multiplexers, to amplify the pulses of the selected lines from the multiplexers; and
   a power combining circuit, coupled to the power amplifier, to combine the amplified pulses from the power amplifier.

9. The circuitry of claim 6, wherein the discrete amplitude vectors have various discrete amplitudes, the discrete phase modulator includes multiplexers coupled to the phase generator and to the quantizer, the discrete phase modulator further includes pulse count modulators coupled to the multiplexers and to the quantizer, and converting the vector pair includes:
   with the multiplexers, selecting lines from among the multiple lines, wherein the pulses of the selected lines are representative of quantized phases of the vector pair from the quantizer; and
   with the pulse count modulators, in response to the pulses of the selected lines from the multiplexers, and in response to discrete amplitudes of the vector pair from the quantizer, generating modulated pulses that are representative of quantized phases and discrete amplitudes of the vector pair.

10. The circuitry of claim 9, further comprising:
    a power amplifier, coupled to the pulse count modulators, to amplify the modulated pulses from the pulse count modulators; and
    a power combining circuit, coupled to the power amplifier, to combine the amplified modulated pulses from the power amplifier.

11. A method performed by circuitry for generating a discrete amplitude signal pair having quantized phases, the method comprising:
    receiving an input signal that is a complex signal having: a first component that is a variable amplitude I component; and a second component that is a variable amplitude Q component;
    noise shaping the input signal;
    with a quantizer, quantizing the noise-shaped input signal to fit a vector pair from among a domain of discrete amplitude vectors having quantized phases, wherein combined amplitudes and combined phases of the vector pair are represented by an I value and a Q value from the quantizer; and
    converting the vector pair from the quantizer into the discrete amplitude signal pair having quantized phases;
    wherein the noise shaping of the input signal includes: subtracting the I value from the first component of the input signal to generate a first difference thereof; subtracting the Q value from the second component of the input signal to generate a second difference thereof; and loop filtering the first and second differences to generate the noise-shaped input signal.

12. The method of claim 11, wherein the discrete amplitude vectors have a same constant discrete amplitude.

13. The method of claim 11, wherein the discrete amplitude vectors have various discrete amplitudes.

14. The method of claim 11, wherein the vector pair is represented by voltages.

15. The method of claim 11, wherein the vector pair is represented by digital values.

16. The method of claim 11, further comprising: with a phase generator, generating multiple lines of discretely delayed pulses, wherein the multiple lines are representative of respective quantized phases.

17. The method of claim 16, wherein the discrete amplitude vectors have a same constant discrete amplitude, and converting the vector pair includes:

with multiplexers, selecting lines from among the multiple lines, wherein the pulses of the selected lines are representative of quantized phases of the vector pair from the quantizer.

18. The method of claim 17, further comprising:

with a power amplifier, amplifying the pulses of the selected lines from the multiplexers; and with a power combining circuit, combining the amplified pulses from the power amplifier.

19. The method of claim 16, wherein the discrete amplitude vectors have various discrete amplitudes, and converting the vector pair includes:

with multiplexers, selecting lines from among the multiple lines, wherein the pulses of the selected lines are representative of quantized phases of the vector pair from the quantizer; and with pulse count modulators, in response to the pulses of the selected lines from the multiplexers, and in response to discrete amplitudes of the vector pair from the quantizer, generating modulated pulses that are representative of quantized phases and discrete amplitudes of the vector pair.

20. The method of claim 19, further comprising:

with a power amplifier, amplifying the modulated pulses from the pulse count modulators; and with a power combining circuit, combining the amplified modulated pulses from the power amplifier.

\* \* \* \* \*